United States Patent [19]

Stephens et al.

[11] Patent Number: 4,943,782
[45] Date of Patent: Jul. 24, 1990

[54] FOUR-PASS PHASE CONJUGATE OPTICAL AMPLIFIER SYSTEM AND METHOD

[75] Inventors: Ronald R. Stephens, Westlake Village; Richard R. Craig, Los Angeles; Huan W. Yen, Westlake; Richard C. Lind, Woodland Hills, Calif.

[73] Assignee: Hughes Aircraft Company, Los Angeles, Calif.

[21] Appl. No.: 170,957
[22] Filed: Mar. 21, 1988
[51] Int. Cl.$^5$ .................................................. H01S 3/98
[52] U.S. Cl. .................................................. 330/4.3
[58] Field of Search .................. 330/4.3; 372/21, 33; 350/354

[56] References Cited

U.S. PATENT DOCUMENTS

| | | | |
|---|---|---|---|
| 3,656,836 | 4/1972 | deCremoux et al. | 372/43 X |
| 3,657,735 | 4/1972 | Nicoll | 372/43 |
| 3,700,309 | 10/1972 | Skolnik et al. | 330/4.3 X |
| 3,701,044 | 10/1972 | Paoli et al. | 330/4.3 X |
| 3,843,401 | 10/1974 | Carroll | 372/49 |
| 3,868,589 | 2/1975 | Wang | 330/4.3 X |
| 4,649,351 | 3/1987 | Veldkamp et al. | |
| 4,649,357 | 3/1987 | Veldkamp et al. | 330/4.3 |
| 4,744,088 | 5/1988 | Heinen et al. | 372/49 X |
| 4,757,268 | 7/1988 | Abrams et al. | 330/4.3 |

FOREIGN PATENT DOCUMENTS

86/07165 12/1986 World Int. Prop. O. .

OTHER PUBLICATIONS

R. R. Stephens et al., "Phase Conjugate Master Oscillator-Power Amplifier Using BaTiO$_3$ and AlGaAs Semiconductor Diode Lasers", Appl. Phys. Lett., 50(11), Mar. 16, 1987, pp. 647-649.
S. Yu Natarov et al., "Specific Configuration of a Four-Pass Laser Amplifier with a Stimulated Brillouin Scattering Mirror", Sov. J. Quantum Electron., 14(6), Jun. 1984, pp. 871-872.
N. F. Andreev et al., "Multipass Amplifier with Full Utilization of the Active Element Aperture", Sov. J. Quantum Electron., 13(5), May 1983, pp. 641-643.
I. D. Carr et al., "Performance of a Nd:YAG Oscillator/Amplifier with Phase-Conjugation via Stimulated Brillouin Scattering", Appl. Phys. B 36,83-92, (1985), pp. 83-92.
Z. L. Lidu et al., "Surface-Emitting GaInAsP/InP Laser with Low Threshold Current and High Efficiency", Appl. Phys. Lett., 46(2), Jan. 15, 1985, pp. 115-117.
G. A. Evans et al., "Surface-Emitting Second Order Distributed Bragg Reflector Laser with Dynamic Wavelength Stabilization and Far-Field Angle of 0.25°", Appl. Phys. Lett., 49(6), Aug. 11, 1986, pp. 314-315.
K. Iga et al., "Room-Temperature Pulsed Oscillator of GaAlAs/GaAs Surface Emitting Injection Laser", Appl. Phys. Lett., 45(4), Aug. 15, 1984, pp. 348-350.
J. Leger et al., "Coherent Beam Addition of GaAlAs Lasers by Binary Phase Gratings", Applied Physics Letters, vol. 48, pp. 888-890, 1986.
J. Feinberg, "Self-Pumped, Continuous-Wave Phase Conjugator Using Internal Reflection", Optics Letters, vol. 7, No. 10, Oct. 1982, pp. 486-488.
M. Cronin-Golomb et al., Applied Physics Letters, vol. 47, 1985, p. 567.

Primary Examiner—Stephen C. Buczinski
Assistant Examiner—Mark Hellner
Attorney, Agent, or Firm—V. D. Duraiswamy; P. M. Coble; W. K. Denson-Low

[57] ABSTRACT

A four-pass conjugate optical amplifier system and method are disclosed in which a linear polarized optical beam is directed by various optical elements through four passes of a power amplifier, preferably a diode laser structure. The beam is phase conjugated at the optical midpoint between the second and third amplifying passes, and is controlled by the optical elements so that its polarization is substantially the same during the first and second passes, and again substantially the same during the third and fourth amplifying passes. This is accomplished by a reflective coating on the back facet of the diode laser structure, with a non-reciprocal polarization rotation element located in the beam path between the phase conjugate mirror and power amplifier. For considerably enhanced power amplification, the beam may be divided into an array of subbeams, which are individually amplified by four passes through respective power amplifiers. The subbeams are processed by the optical system so that they recombine into a single coherent output beam after full amplification.

39 Claims, 8 Drawing Sheets

FIG.9.
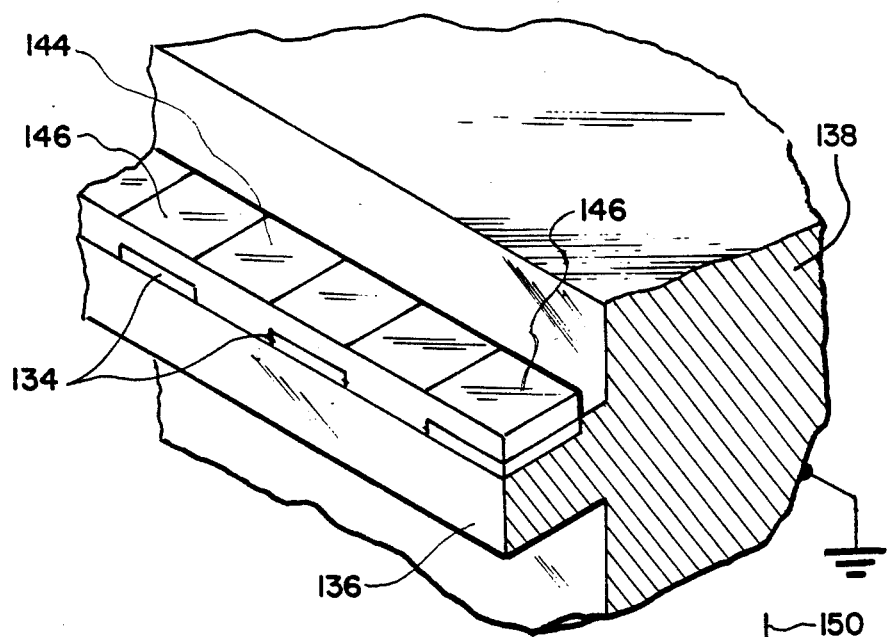
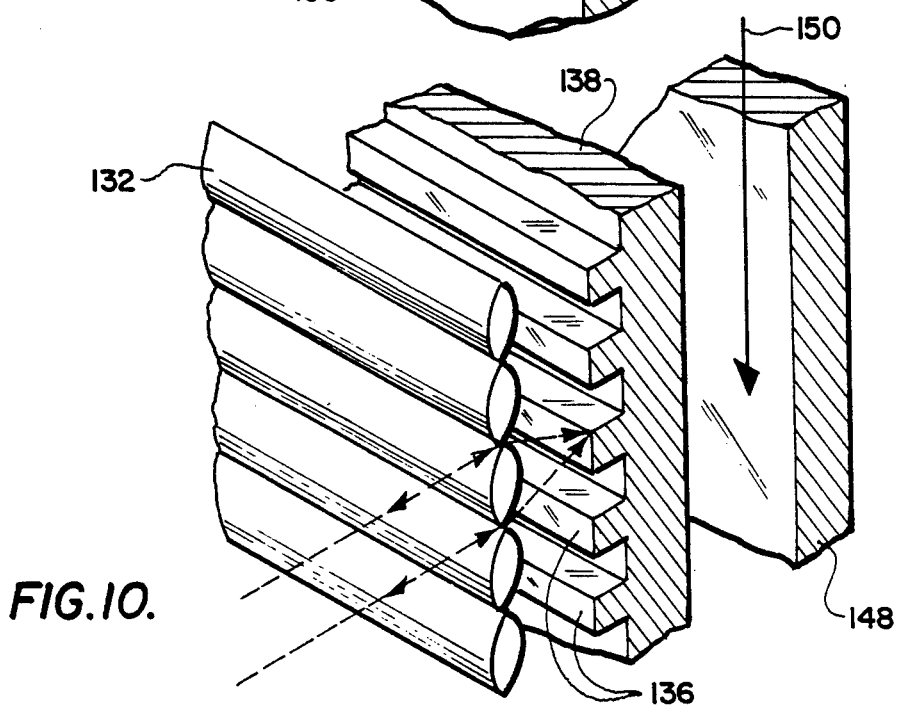
FIG.10.

FOUR-PASS PHASE CONJUGATE OPTICAL AMPLIFIER SYSTEM AND METHOD

RELATED APPLICATION

This application is related to application Ser. No. 736,877, filed May 22, 1985 by Abrams et al. for "Energy Scalable Laser Amplifier", and assigned to Hughes Aircraft Company, the assignee of the present application.

BACKGROUND OF THE INVENTION

1. Field of the Invention

This invention relates to apparatus and methods for amplifying the power of an optical beam such as a laser beam, and more particularly to an amplification technique in which the beam to be amplified is processed in four passes through an amplification device.

2. Description of the Related Art

Numerous studies and investigations have been made toward amplifying the power of an optical beam, particularly a coherent laser beam. Applications for amplified beams include free space communications, generation of visible light by harmonic generation or Raman shifting, laser target designation, and range finding.

One recent approach to laser amplification is described in an article by Stephens, Lind and Guiliano, "Phase Conjugate Master Oscillator-Power Amplifier Using BaTiO$_3$ and AlGaAs Semiconductor Diode Lasers", Applied Physics Letters, 50(11), 16 March 1987, pages 647-49. This system may be described as employing two-pass amplification, since the beam is transmitted twice through a diode laser structure which is employed for amplification. The laser beam to be amplified is transmitted in one direction through the diode laser amplifier, and strikes a phase conjugate mirror (PCM) on the opposite side of the power amplifier. A phase conjugated beam is retro-reflected by the PCM back through the power amplifier, where it is amplified a second time. The original beam is linearly polarized, and optical elements such as polarizing beam splitters and half-wave plates are located in the beam path so that the twice-amplified beam is deflected out of the system as an output.

While significant amplification was achieved with this system, the potential for even greater amplification exists if the beam could be processed through the power amplifier more than twice. Although this is beyond the capability of the described Stephens et al. system, a number of other systems have been disclosed in the literature which achieve four-pass amplification.

One of the four-pass systems is illustrated in FIG. 1, and was described in Natarov and Shklovskii, "Specific Configuration of a Four-Pass Laser Amplifier With a Stimulated Brillouin Scattering Mirror", Soviet Journal of Quantum Electronics 14(6), June 1984, pp. 871-72. A collimated, linearly polarized laser beam from a master oscillator (MO) 2 was passed through a polarizing beam splitter (PBS) 4 and a quarter-wave plate 6 to give the beam circular polarization, and then through a bulk Stimulated Brillouin Scattering (SBS) phase conjugate mirror 8 and power amplifier 10 in the form of a Nd:YAG laser. On the first beam pass, the power level and beam diameter were such that the intensity inside PCM 8 was below the SBS threshold, and therefore phase conjugation did not take place. After the first pass, the beam was reflected off a concave mirror 12, which reflected it back through the amplifier 10 to a focus inside the PCM 8. Since the intensity of the focused beam was above the SBS threshold, a phase-conjugate retro-beam was reflected from the PCM back through the amplifier for a third pass. The retrobeam was the phase conjugate of the original focused beam, and therefore retraced the exact path of the first and second amplifier passes, exiting from the power amplifier after a fourth pass as a collimated beam. During its last pass through the PCM, the beam diameter was once again large enough so that no SBS occurred, and the beam passed through unreflected to be coupled out of the system by PBS 4. The MO input power, and the beam sizes inside the PCM, were carefully chosen so that SBS only occurred in the focused beam after the second pass, and so that most of the power amplification was extracted on the third and fourth passes. This latter feature was employed so that any loss in the conjugation process occurred at a relatively low-power level, thereby maximizing the power extraction from the power amplifier.

The system of FIG. has two principal drawbacks. First, it would be desirable to employ a self-pumped type of PCM such as the BaTiO$_3$ cube employed in the Stephens et al. two-pass system described above. However, the Natarov and Shklovskii approach requires the beam to pass through and into the PCM four times, with a different conjugation threshold for various passes. Implementing this approach with BaTiO$_3$ as the conjugator would be difficult, since BaTiO$_3$ does not have a well-defined threshold (if any). The ability to employ an optical fiber PCM would also be desirable, but using SBS in an optical fiber would also be difficult since the optical power is contained within the fiber on all passes, thus precluding the adjustment of intensities by geometrical means. SBS would occur on the fourth pass of the fiber at very high efficiency, thereby preventing any power from being coupled out of the system.

The second drawback of the FIG. 1 configuration is that it is incompatible with a diode laser power amplifier. The use of a diode laser as the amplification device is highly desirable, because of its high efficiency. However, the FIG. 1 system uses circular polarization within the power amplifier, which is incompatible with diode waveguide gain and phase-shift characteristics. Because of gain and phase shift differences between the TE and TM modes of a laser diode (polarized parallel to and perpendicular to the junction plane, respectively), the use of a circularly polarized beam coupled into the Natarov and Shklovskii power amplifier would result in a greatly altered polarization state after several passes. In general, an elliptically polarized beam composed of E field vectors of unequal amplitude would be produced, which would be very difficult to manipulate and couple out of the system.

A four-pass configuration that does not use a four-pass PCM, or circular polarization inside the power amplifier, is illustrated in FIG. 2. It was demonstrated with a Nd:YAG (Neodymium doped yttrium aluminum garnet) solid state laser as the power amplifier in the Soviet Union by Andreev et al., "Multipass Amplifier With Full Utilization of the Active Element Aperture", Soviet Journal of Quantum Electronics 13(5), May 1983, p. 641-43. A laser MO 14 produced a horizontally polarized beam which passed through a first polarizing beam splitter 16, and then through a Faraday rotator 18 which rotated the polarization 45° out of the horizontal plane. A half-wave plate 20 then rotated the polarization back into the plane, after which the beam passed through a second polarizing beam splitter 22 and the power amplifier 24. A quarter-wave plate 26 and retromirror 28 were located behind the power amplifier to rotate the beam's polarization to vertical and reflect it back for a second pass through the power amplifier. After the second amplification pass, the second PBS 22 directed the beam into a PCM 30. Here the beam was conjugated and reflected back for a third pass through the power amplifier 24 with vertical polarization, and a fourth amplifying pass with horizontal polarization. With its horizontal polarization from the fourth pass, the beam was transmitted through the second PBS 22 to the first half-wave plate 20 and Faraday rotator 18, which rotated the polarization vertical again. With this polarization the beam was deflected by the first PBS 16 out of the system as an amplified output beam.

A variation of the Andreev et al. system was described in an article by Carr and Hanna, "Performance of a Nd:YAG Oscillator/Amplifier With Phase-Conjugation Via Stimulated Brillouin Scattering", Applied Physics B 36, 1985, pages 83–92. This system employed a loop configuration on the opposite side of the power amplifier from the PCM to reflect the beam and rotate its polarization. Referring to FIG. 3, a third polarizing beam splitter 32, half-wave plate 34 and a pair of reflectors 36 and 38 were used in place of the quarter-wave plate 26 and mirror 28 of Andreev et al.

It would be possible to use a diode laser power amplifier in the Andreev et al. and Carr and Hanna systems, since they employ linear polarization in the power amplifier and the PCM encounters the beam only once. However, with the use of a diode laser rather than the solid state lasers disclosed, there would be a serious power loss. This would occur at the start of the second pass through the power amplifier, where the beam must be coupled back into the power amplifier channel. A considerable insertion loss would be expected, with likely values of 5–7 dB, or even higher losses if there are strong aberrations in the power amplifier. This will result in reduced power extraction and lowered electrical efficiency. Thus, there is still a need for a four-pass beam amplification system that can efficiently use a diode laser as the power amplification element.

Another limitation to laser amplification is that individual power amplifiers have power limitations which may be less than the desired output beam power. In an alternate approach to achieving a greater output power, research has been conducted on the possibility of forming an aggregate output beam from monolithic arrays of lasers which are fabricated on the top surface of an AlGaAs or InGaAsP wafer. Consideration has been given to systems in which emitted light is directed perpendicular to the wafer surface by beveled mirrors etched into the surface adjacent to the emitting facets (Liau and Walpole, "Surface-Emitting GaInAsP/InP Laser With Low Threshold Current and High Efficiency", Applied Physics Letters 46(2), 15 January 1985, p. 115–17), to the use of distributed Bragg reflectors (Evans et al., "Grating Surface Emitting Laser With Dynamic Wavelength Stabilization and Far Field Angle of 0.25 Degrees", Applied Physics Letters, Vol. 49, pp. 314–15, 1986), or by having the laser optical cavity directed through the thin dimension of the laser normal to the surface (K. Iga et al., "Room Temperature Pulsed Oscillation of GaAlAs/GaAs Surface-Emitting Injection Laser", Applied Physics Letters, Vol. 45, pp. 348–50, 1984).

Since the above devices are fabricated on the top surface of substrates which are far from heat sinks, heat dissipation is poor and continuous wave (CW) operation does not appear to be feasible. The lasers in such an array may be made to operate at the same wavelength by injection-locking to an external laser, or by coupling the lasers together through waveguide arrangements on the wafer. However, no practical way to phase-lock the laser outputs has yet been devised, and it is not clear that output phase-locking could be accomplished with this type of array. Even if output phase-locking were possible, the large inactive areas between emitters would produce a highly thinned array, causing the output beam to have a very large fraction of the power in its side lobes.

SUMMARY OF THE INVENTION

In view of the above limitations in the related art, the present invention seeks to provide an optical beam amplification system and method which guides an optical beam in four passes through a power amplifier, is compatible with the use of a diode laser as an amplifier, and exhibits high efficiency and a low level of optical aberrations.

A further purpose of the invention is to provide a mechanism for additional beam amplification by dividing the beam into a plurality of subbeams, amplifying each of the subbeams separately, and then recombining the amplified subbeams into a high intensity output beam in which the subbeams are aligned, in phase and colinear. The invention also seeks to provide a greatly improved heat dissipation mechanism to permit a high level of amplification from an amplifier array.

In accordance with the invention, an optical beam, preferably a linearly polarized laser beam, is directed by an optical system from a beam source through first and second amplifying passes through a bidirectional power amplifier. After the first two amplifying passes, the beam is diverted to a PCM, where it is phase conjugated and then returned for third and fourth passes through the power amplifier. The optical system maintains the beam's polarization substantially the same during its first and second amplifier passes, and substantially the same during its third and fourth amplifier passes. In this way a laser diode structure can be efficiently used for the power amplifier.

The preferred diode laser amplifier has a reflective coating on one side which reflects the beam from its first to its second pass, and again from its third to its fourth pass, without changing its polarization on either reflection. A non-reflective coating is provided on the opposite side of the diode laser structure to prevent lasing action. The optical system orients the beam's polarization substantially parallel to the diode laser's TM mode for the first and second beam passes, and substantially parallel to the diode laser's TE mode for the third and fourth passes, thus ensuring that the beam power level is still relatively low when it reaches the PCM so that the power dissipated in conjugator losses is controlled. The optical system is polarization sensitive, and rotates the beam's polarization during transit from its source to the ultimate output path. This allows the beam to be diverted to the PCM in a path that is in a substantially common plane with the beam's final output path, thereby simplifying the system.

A greatly expanded degree of power amplification is achieved by dividing the original beam into a plurality of subbeams, each of which is directed to first and second amplifying passes through respective optical amplifiers within an overall array of bidirectional amplifiers. The subbeams are then phase conjugated and returned to their respective power amplifiers for third and fourth amplifying passes. Finally, the amplified subbeams are recombined into an aggregate output beam. Phase gratings are preferably employed to divide the original beam into subbeams, and then recombine the amplified subbeams into an output beam. The use of a PCM at the midpoint of the optical path has been found to result in an overall reciprocal system operation in which the subbeams follow optically symmetrical paths before and after conjugation, thereby enabling an effective recombination into a single output beam.

The diode laser structures used to amplify the subbeams are arranged in a two-dimensional array on a common heat sink, which provides for efficient operation and long life. The heat sink consists of a body of thermoconductive material from which a plurality of generally parallel and aligned shelves extend, with the diode laser structures distributed along the shelves in thermoconductive contact therewith. A channel is preferably provided within the heat sink body for a coolant fluid, which accelerates the dissipation of heat from the individual diode laser structures. Since substantially all of the subbeams are directed through respective diode laser amplifiers, with little or none of the subbeams lost outside of the amplifiers, there are no major intensity variations in the near field of the output beam. The far field pattern thus has the desirable characteristic of a single dominant lobe containing a large fraction of the output power.

These and other features and advantages of the invention will be apparent to those skilled in the art from the following detailed description of preferred embodiments, taken together with the accompanying drawings, in which:

DESCRIPTION OF THE DRAWINGS

FIG. 9 is a cutaway perspective view showing a portion of the heat sink body used to support a line of power amplifiers;

FIG. 10 is a cutaway perspective view showing a larger portion of the heat sink body, including a cooling channel;

FIG. 11 is a cutaway sectional view showing an alternate construction for the heat sink; and FIG. 12 is an illustrative diagram indicating the action of the optical apparatus of FIG. 11 on a number of subbeams after a second amplifying pass.

DETAILED DESCRIPTION OF PREFERRED EMBODIMENTS

Figure 1:
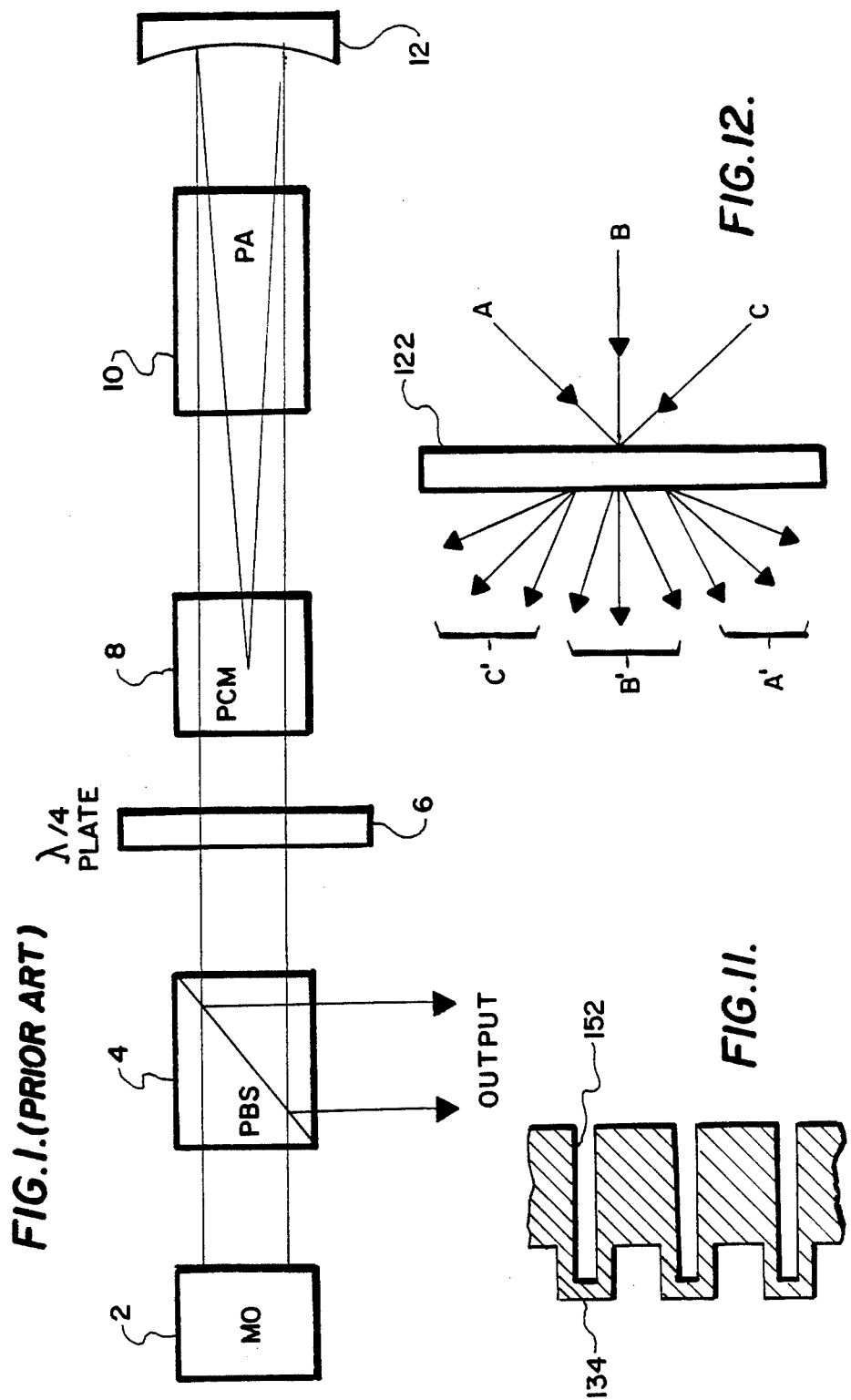
FIGS. 1-3 are block diagrams of related four-pass phase conjugate optical amplifier systems, described above.
Figures 2, 3:
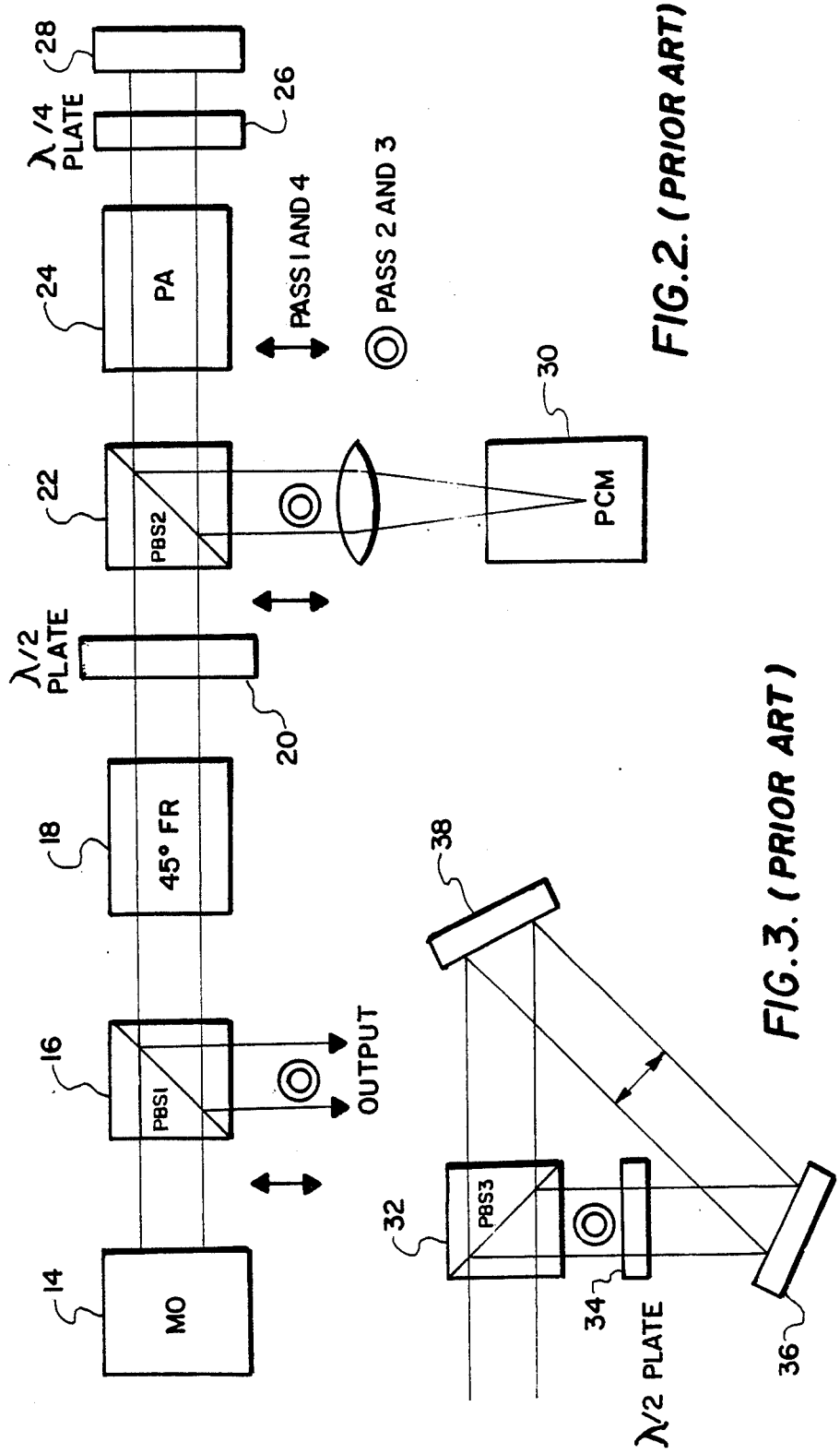
Figure 4:
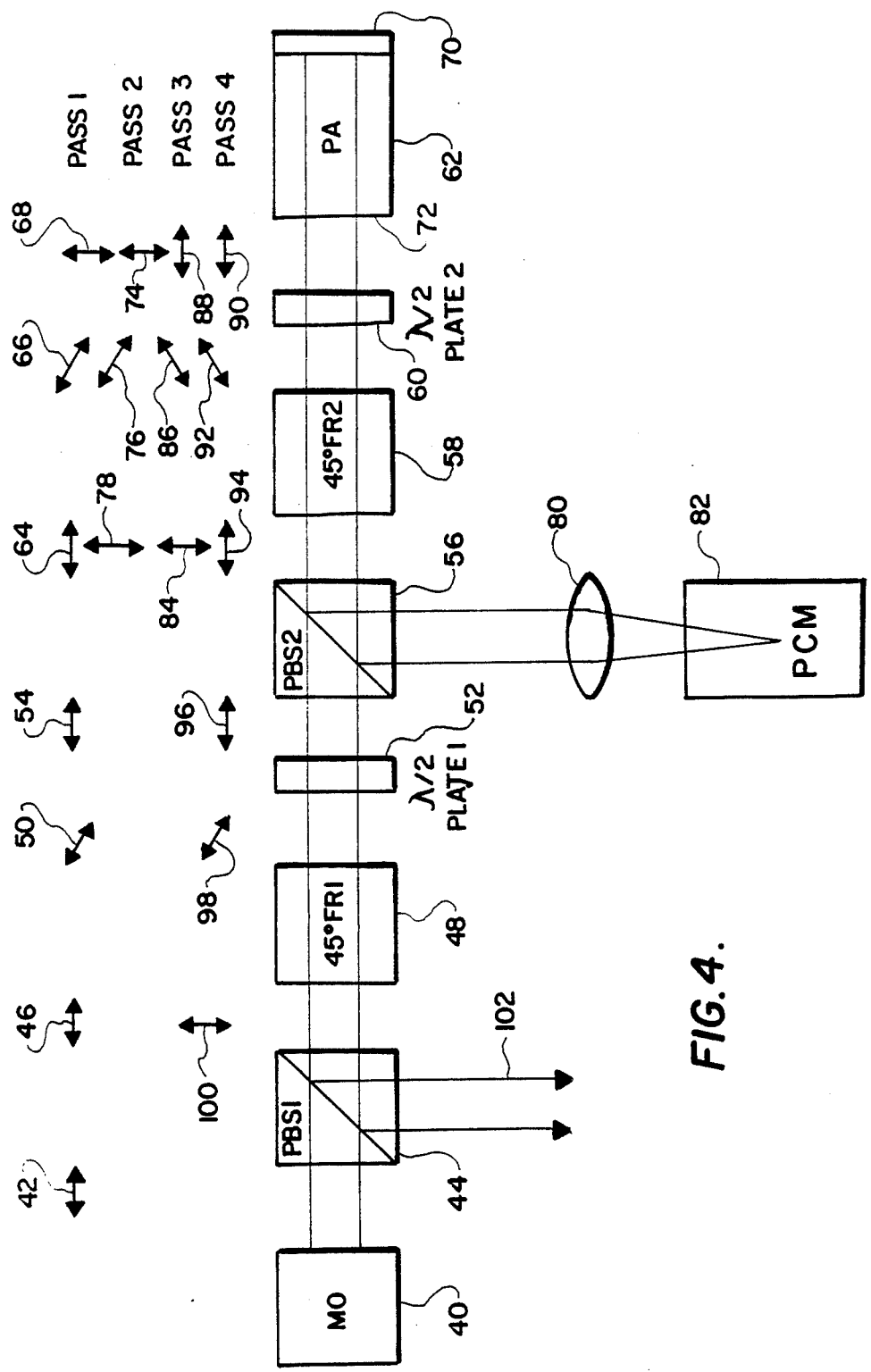
FIG. 4 is a block diagram of a preferred embodiment of the optical amplification system of the present invention for a single beam, with the beam polarization at various locations in the system indicated along the top of the figure.

A preferred embodiment of the invention for the amplification of a single beam is shown in FIG. 4. A master oscillator MO 40 produces an optical beam to be amplified; "optical" is used in a broad sense and is not restricted merely to the visible portion of the electromagnetic spectrum. MO 40 is preferably a single transverse mode, single frequency diode laser with a diffraction limited output beam. The Hitachi Corp. HLP 1400 AlGaAs diode laser operated at 15 mW cw output is a suitable source. Alternately, the MO function could be provided by the output of a prior beam amplification stage. The MO emits a horizontally polarized laser beam, as indicated by the horizontal polarization vector arrow 42 in the "pass 1" line at the top of FIG. 4. In this diagram the polarization vectors are shown as they would be measured by an observer whose eyes are in the plane of the page and located at MO 40 looking down the beam toward optical power amplifier 62. Polarization vector 42 is thus located in the plane of the page and perpendicular to the direction of beam propagation.

The beam is transmitted through a first polarizing beam splitter (PBS) 44. This is a conventional device, which either deflects or transmits the beam undisturbed, depending upon the beam's polarization. A suitable polarizing beam splitter is produced by CVI Laser Corp. under part number PBS 5-82. The PBS 44 is oriented so that it transmits the beam from MO 40 without any deflection. The polarization of the beam emitted from PBS 44 is still horizontal, as indicated by polarization vector 46. The beam is next directed through a 45° Faraday rotator 48, which rotates its polarization 45° to the angle indicated by vector 50, and then through a half-wave plate 52 which rotates the polarization back to horizontal, as indicated by vector 54; half-wave plate 52 has an axis at 22.5° out of the horizontal plane. Although the net effect of Faraday rotator 48 and half-wave plate 52 is to leave the beam travelling from left to right with its original horizontal polarization, their net effect on a horizontally polarized beam travelling from right to left is to rotate its polarization 90° to vertical. This is because the Faraday rotator 48 is a non-reciprocal device which rotates the beam's polarization in the same angular direction regardless of the beam's direction, whereas half-wave plate 52 is a reciprocal device which reverses the direction of the angular polarization rotation when the beam's direction is reversed. These characteristics are employed to enable PBS 44 to transmit an input beam undisturbed, but to deflect a contra-directed output beam out of the system. Also, the use of a half-wave plate permits the remaining system elements to be kept in essentially a single plane, rather than distributed in three dimensions, and thus simplifies the system.

Half-wave plate 52 passes the beam on to a second polarizing beam splitter 56, which is oriented to transmit the beam through a second 45° Faraday rotator 58 and second half-wave plate 60 to an optical power amplifier 62. PBS 56 does not affect the beam's polarization, as indicated by polarization vector 64. Faraday rotator 58 rotates the beam polarization 45°, as indicated by vector 66, while half-wave plate 60 has an axis which is tilted 22.5° from vertical, and rotates the beam polarization to vertical vector 68.

While power amplifier 62 could be implemented with the various devices discussed above, it is preferably formed from a conventional type of diode laser structure. Rather than providing the usual mirrors at opposite ends of the laser structure, a highly reflective coating 70 is formed on the far end of the power amplifier from the remainder of the optical system, while an antireflection coating 72 is provided on the front facet. This configuration prevents lasing action, and ensures that the device functions as an amplifier. The amplifier would typically be operated at a few volts DC and a current in the order of 1 amp.

The vertically polarized beam makes a first pass through the amplifier 62, is reflected off the back coating 70, and immediately makes a second pass through the amplifier in the opposite direction, obtaining an amplification on each pass. Amplifier 62 is preferably a large optical cavity structure, which is a conventional diode laser with two extra layers on either side of the active region to permit better coupling of light into the amplifier.

The beam emerging from the amplifier after the second amplification pass is vertically polarized, as indicated by vector 74. Encountering half-wave plate 60 again, the polarization is rotated 45° as indicated by vector 76, while Faraday rotator 58 rotates the polarization back to vertical as indicated by vector 78. With this polarization, PBS 56 deflects the beam out of its original path and through a focusing lens 80 to a phase conjugate mirror 82. PCM 82 is preferably a self-pumped device; other types such as two-wave or four-wave PCMs could also be used, but would add considerable complexity to the system. Optical fibers could be employed for the PCM, as could a cube of BaTiO$_3$ arranged in a self-pumped ring configuration similar to that discussed in M. Cronin-Golomb, K. Y. Lau and A. Yariv, Applied Physics Letters 47, 1985, p. 567, or a cube of BaTiO$_3$ arranged to be internally self-pumped similar to that discussed in J. Feinberg, Optics Letters 7, 1982, p. 486.

PCM 82 conjugates the beam and reflects it back into the system, the beam deflecting off PBS 56 and proceeding in a third pass through Faraday rotator 58, half-wave plate 60 and power amplifier 62. The vertically polarized beam reflected by PCM 82 is progressively rotated to a horizontal polarization prior to entering amplifier 62, as indicated by polarization vectors 84, 86 and 88. The horizontally polarized beam then makes third and fourth passes through the power amplifier. Its polarization is maintained horizontal as it proceeds back through half-wave plate 60 and Faraday rotator 58 after its fourth amplifying pass, as indicated by polarization vectors 90, 92 and 94. Its horizontal polarization allows it to pass through PBS 56 undeflected. The polarization is rotated vertical by the first half-wave plate 52 and Faraday rotator 48, as indicated by polarization vectors 96, 98 and 100. The first PBS 44 responds to the beam's vertical beam 102.

In FIG. 4, the diode junction of power amplifier 62 is in the plane of the page. Passes 1 and 2, in which the beam polarization is vertical, therefor generate lower gain TM modes, while in passes 3 and 4 the horizontally polarized beam is parallel to the diode junction, and therefor produces higher gain TE modes. Since a greater portion of the beam power is located in the active laser region for the TE than for the TM mode, the effective laser coefficient is higher on passes 3 and 4. This effect, combined with the greater beam intensity present at the start of pass 3 compared to that present at the start of pass 1, allows most of the amplifying power to be extracted on the third and fourth amplifying passes, after conjugation. Performing the conjugation after the second pass, when the beam power is still relatively low, has been found to minimize the power dissipated in conjugator losses, thereby maximizing overall power extraction from the system.

Figure 5:
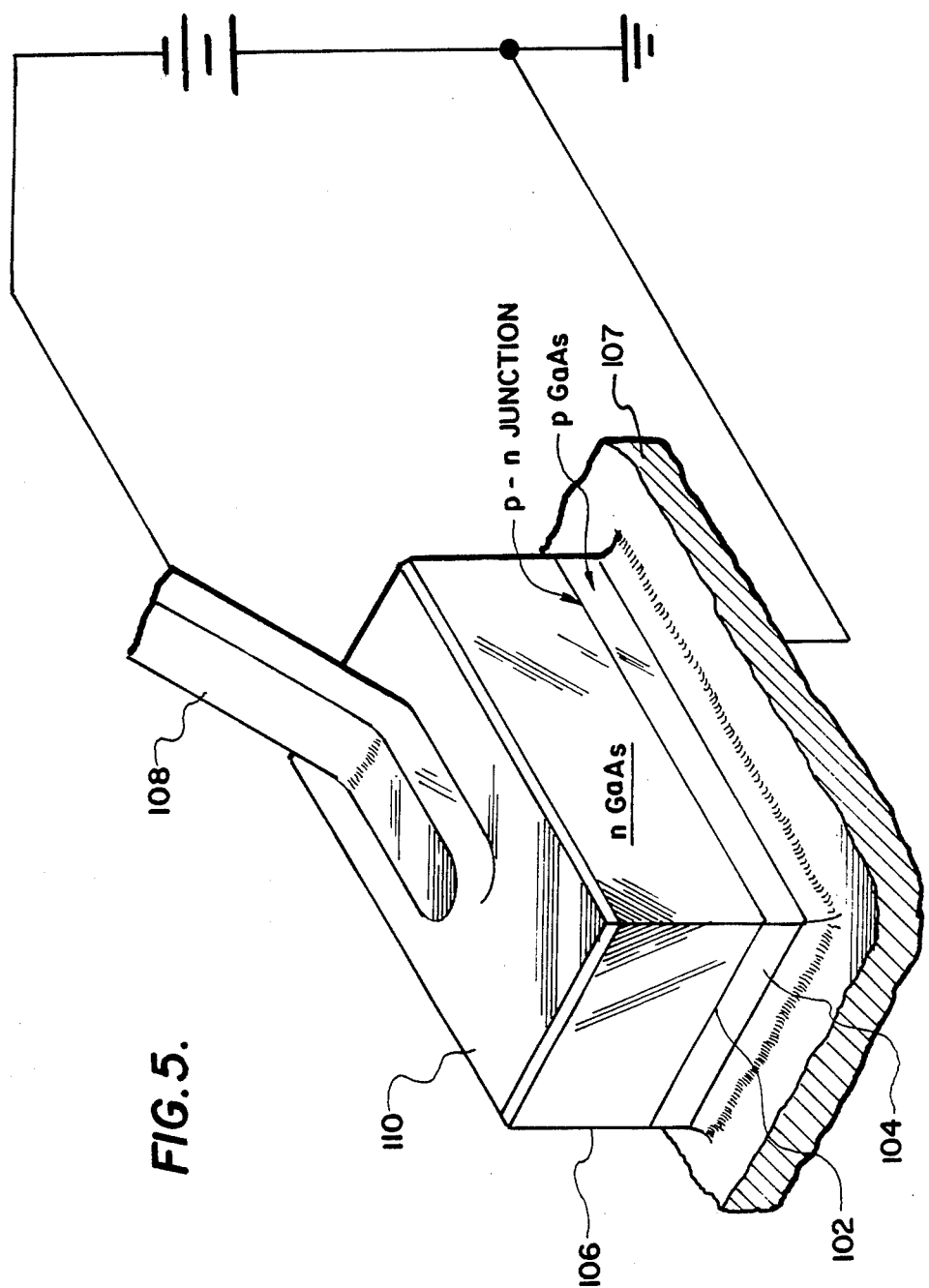
FIG. 5 is a simplified perspective view showing a typical diode laser structure that can be used as the amplifying element of the present invention.

FIG. 5 illustrates the external features of a typical diode laser structure that can be used for the power amplifier. An optical channel is formed about a junction 102 between oppositely doped blocks of semiconductor material, such as p- and n- doped GaAs 104, 106, respectively. The overall laser body is formed on a substrate 107, which dissipates heat. A DC voltage is applied to the device through a lead wire 108 connected to a metal contact layer 110 on the top of the structure, the underside of the structure being grounded through substrate 107.

Figure 6:
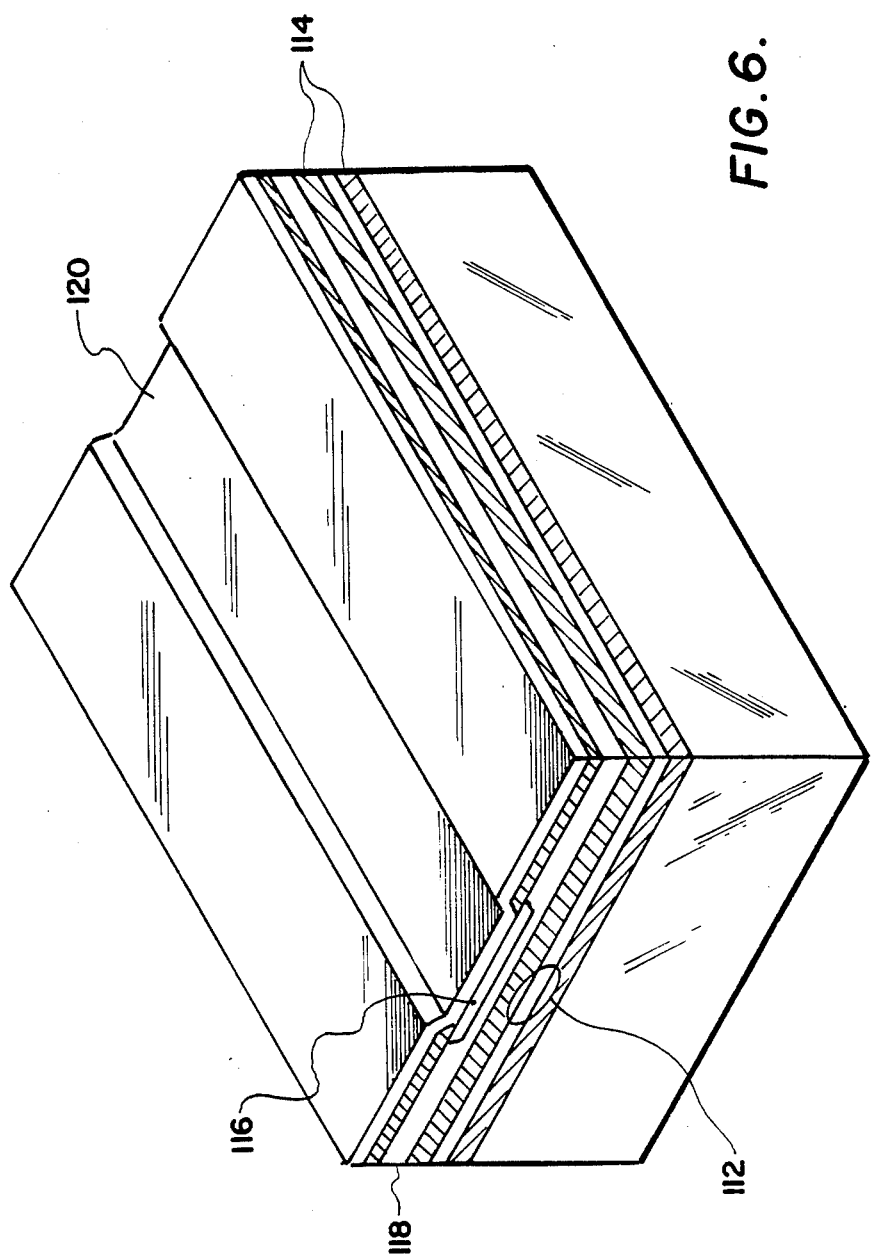
FIG. 6 is a partially cutaway perspective view showing the internal structure of the diode laser depicted in FIG. 5.

A typical interior structure for the diode laser power amplifier is illustrated in FIG. 6, employing a stripe-geometry structure. The active layer 112 is sandwiched between two layers 114 of higher bandgap material that confine the beam. A zinc skin diffusion 116 extends in a stripe above the active region which is between the double heterostructure layers 114, while an insulating oxide layer 118 extends laterally from each edge of the zinc diffusion. A stripe contact 120 is formed over the zinc diffusion to provide access for an external electrical connection.

The optical amplification system described thus far provides more efficient amplification of a single beam than has been achieved by related systems. This amplification can be greatly increased, however, with the multibeam system shown in FIG. 7. Many of the elements of this system are the same as the single beam system of FIG. 4, and are indicated by the same reference numbers. The basic difference is that, instead of amplifying the original beam as a whole, the beam is divided up into a large number of subbeams. The subbeams are each amplified individually, and then recombined into an aggregate output beam in a unique manner that aligns the subbeams in phase, colinear and aligned with each other, despite differences in the subbeam path lengths and optical processing.

This multiple beam approach overcomes power limitations inherent in present single diode lasers, which are quite small with junction thicknesses in the order of a micron, and dimensions in the junction plane of at most hundreds of microns. It is difficult to significantly increase the size of these devices because of thermal dissipation problems.

Figure 7:
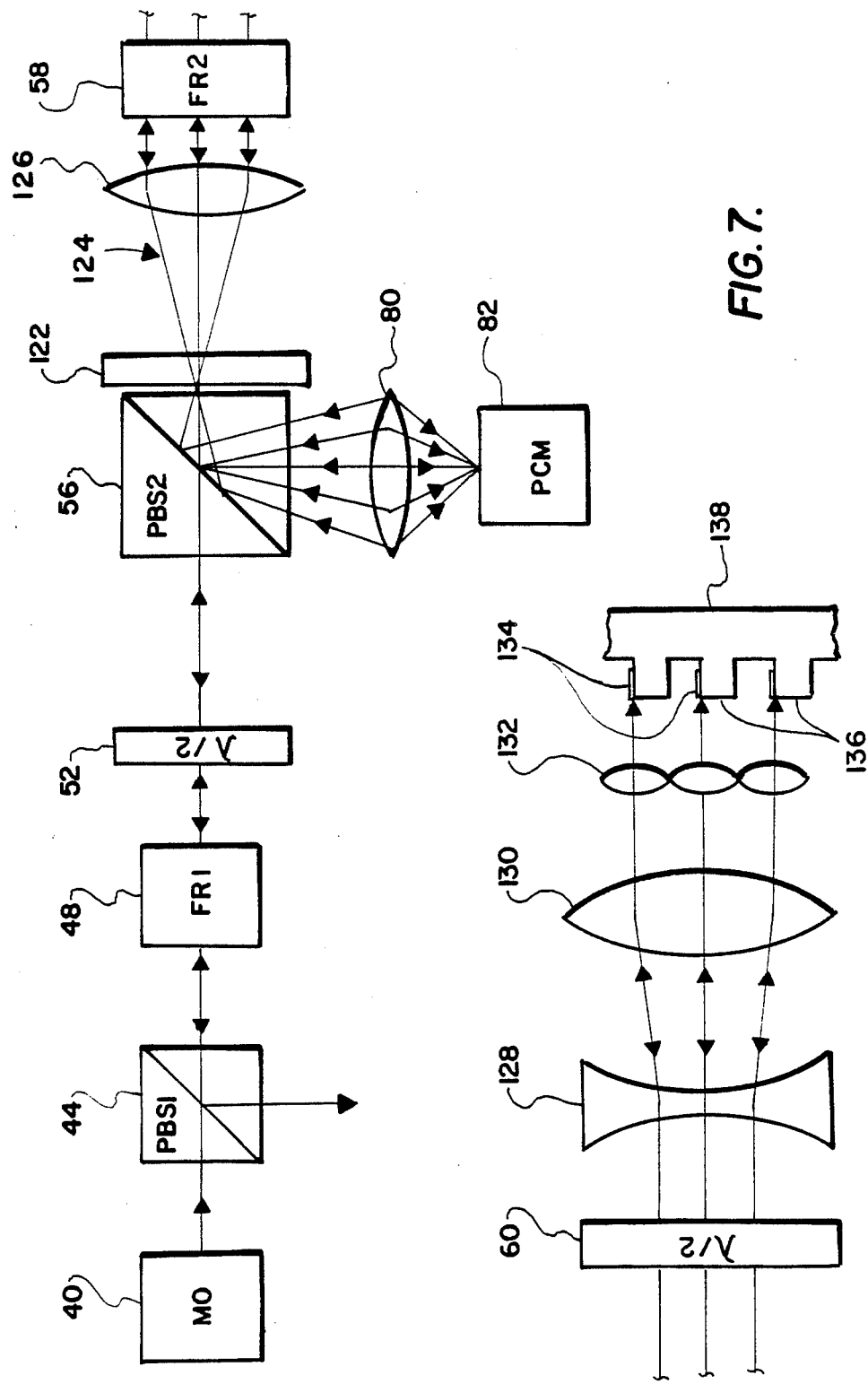
FIG. 7 is a simplified block diagram showing another embodiment of the invention in which the original beam is divided into subbeams, which are individually amplified and then recombined into an aggregate output beam.

The multiple beam system of FIG. 7 is substantially identical to the single beam system of FIG. 4 from the MO 40 to the second PBS 56. A low power, single frequency, diffraction limited beam from MO 40 is transmitted through PBS 56 to a pair of crossed-binary phase gratings 122, which divide the beam into an NxM matrix of subbeams 124. The subbeams are directed parallel to each other by a lens 126, and are processed through second Faraday rotator 58 and second half-wave plate 60 (the lower portion of FIG. 7 beyond Faraday rotator 58 is shown in the same plane as the upper portion of FIG. 7 for simplification of the drawing, but actually it would be rotated by the amount of rotation imparted by Faraday rotator 58). Another lens 128 then causes the subbeams to diverge away from each other, expanding the dimensions of the overall subbeam array. When a suitable array size is reached, lens 130 redirects the subbeams parallel to each other again. The individual subbeams 124 are then focused by respective lenses 132 onto an array of diode laser power amplifiers 134, which are mounted on respective shelves 136 of a common heat sink back plate 138. A separate power amplifier 134 is provided for each subbeam, and is essentially similar to the power amplifier 62 of the single beam system in FIG. 4. In order to show the individual shelves of the power amplifier array, the bottom portion of FIG. 7 has been rotated 90° with respect to the top portion.

Each of the subbeams performs a double amplifying pass through its respective power amplifier, and then travels back through the optical system to PBS 56, where they are diverted to PCM 82. After conjugation, the subbeams are returned through the optical system back to their respective power amplifiers for third and fourth amplifying passes. They then make a final transit through the optical system, and are combined by phase gratings 122 into a single output beam. This beam is deflected out of the system by the first PBS 44, the various optical elements within the system rotating the polarizations of the individual subbeams in the same manner as the single beam of the FIG. 4 system.

With the described system, each of the power amplifiers 134 is probed by a separate subbeam, with little or none of the beam power lost in the space between amplifiers. Assuming that the amplifiers themselves are uniform, there will accordingly be no major intensity variations in the near field of the output beam. The far field pattern will thus consist of a single dominant lobe containing a large fraction of the output power. Therefore, despite the fact that a thinned array of amplifiers is used, the far field will not have the characteristic multi-lobe output of a typical thinned array. A major problem of using diode laser amplifiers in two-dimensional arrays has thus been solved.

It has been found that, because of the phase conjugation occurring at the optical midpoint between the first/second and third/fourth amplifying passes, the optical processing of the subbeam is essentially symmetrical prior to and subsequent to the PCM. Thus, differences in the individual optical path lengths of the various subbeams are compensated for, and the subbeams will be substantially in phase with each other when they are recombined into an output beam. The phase conjugation step also corrects for individual phase aberrations within the various power amplifiers, since these aberrations will be imposed upon the subbeams both before and after conjugation, and therefore will substantially cancel each other out.

The use of phase gratings in the optical system is highly desirable. Conventional optics could be employed, but system performance would be seriously degraded. For example, beam splitters could be used instead of phase gratings to split the input beam into the various subbeams. However, the system would be extremely complicated for large arrays, and would also be very lossy due to the large number of beam splitters required. This would result in poor power extraction, and low electrical-to-optical efficiency. A simple two-lens beam expander might also be used in place of the phase gratings to flood the amplifier array with a single large beam. With such a system, however, while light would still be focused into the amplifiers, a substantial portion would be lost in the dead regions between amplifiers. In addition, with a two lens beam expander the output beam would have 100% intensity variations (caused by the dead areas between amplifiers) in the near field; this would produce a thinned array far field pattern with a large number of side lobes, thereby reducing the power in the main lobe.

Figure 8:
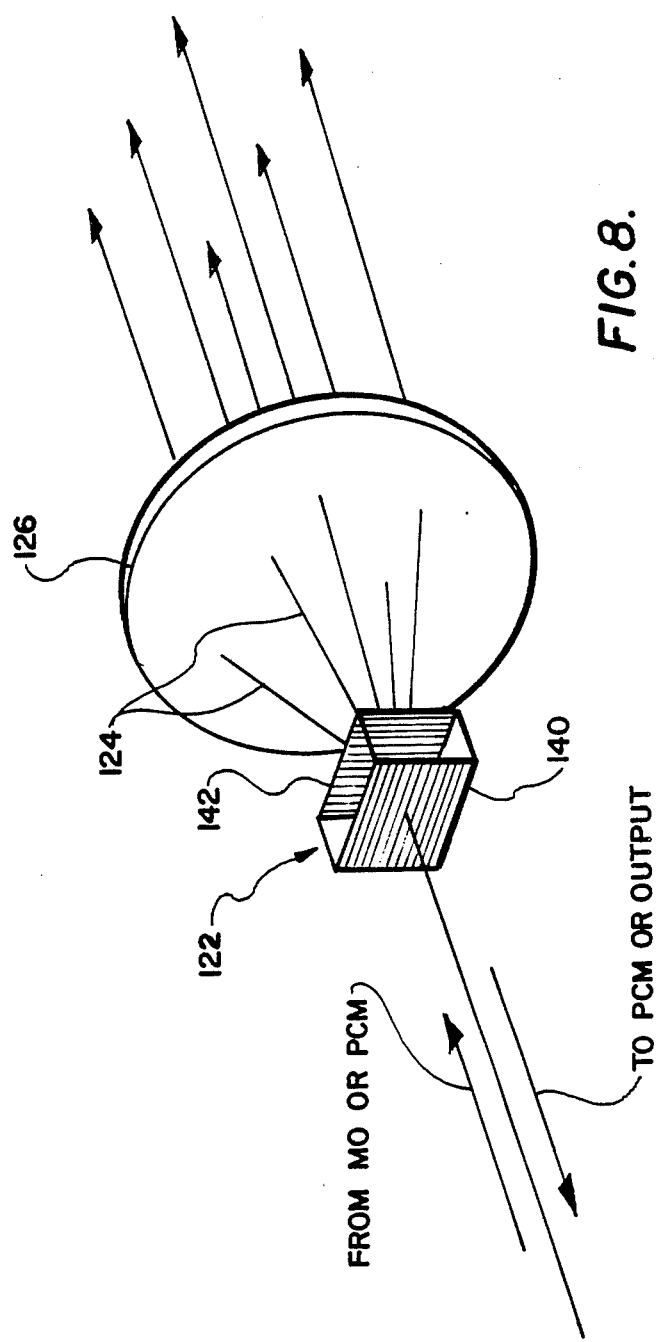
FIG. 8 is a perspective view of the optical elements used to divide a beam into an array of subbeams for amplification, and to recombine the subbeams into an amplified single-beam output.

An enlarged view of the crossed phase gratings 122 and lens 126 is shown in FIG. 8. The phase gratings consist of back-to-back horizontal grating 140 and vertical grating 142. These divide the input beam into a divergent array of subbeams 124, which are deflected parallel to each other by lens 126. While only a 3×2 array of subbeams is illustrated, in actual practice hundreds or thousands of subbeams would be utilized. The construction of crossed phase gratings is known, and is described for example in J. Leger et al., "Coherent Beam Addition of GaAlAs Lasers by Binary Phase Gratings", *Applied Physics Letters*, Vol. 48, pp. 888–90 (1986).

Numerous other variations could be made to the optical system of FIG. 7. For example, lenses 130 and 132 could be replaced with a single holographic element, or lens 130 could be replaced with a set of prisms, one for each of the subbeams. Numerous other structural variations to accomplish the same optical processing functions could also be envisioned.

FIG. 9 is an enlarged view showing one of the shelves 136 which supports a row of power amplifiers 134. Each shelf and backplate 138 is formed from a thermoconductive material, which may be metallic. In the preferred embodiment, an AlGaAs bar 144 has the power amplifiers 134 formed on its underside, and is affixed to the top surface of the shelf 136 with the junction side down for cw operation. Wire bonding pads 146 are provided on the other side of bar 144 for each amplifier. Optical power is coupled into each amplifier through the front cleaved facet, which is anti-reflection coated to prevent lasing, while the rear cleaved facet facing the heat sink body is covered with a high reflectivity coating.

As illustrated in FIG. 10, a wall 148 may be provided behind and spaced from the heat sink body 138 to form a cooling channel therebetween, with a cooling fluid 150 flowed through the channel to increase the rate of heat dissipation from the individual power amplifiers.

Another configuration for the heat sink body is illustrated in FIG. 11. In this approach, a series of horizontal channels 152 are cut in from the back of the body in registration with the shelves 134, bringing the cooling fluid into closer proximity to the power amplifiers.

One of the unique aspects of the present invention is the manner in which the subbeams 124 are recombined back into a single output beam after four amplifying passes. The action of the phase gratings 122 upon the subbeams returning from the second amplifying pass is illustrated in FIG. 12. Three returning subbeams A, B and C are shown. When processed through the phase gratings 122, each of the subbeams will be further divided into respective sets of sub-subbeams A', B' and C'. While the subsubbeams from the various subbeams are illustrated as being separated in FIG. 12 for simplicity, in practice they would tend to overlap to a certain degree. It might be expected that further divisions of the sub-subbeams would occur as they are transmitted through the phase gratings two more times in connection with the third and fourth amplifying passes. However, because they have been conjugated, the sub-sub-beams are found to emerge from phase gratings 122 at the beginning of the third pass along the same three paths A, B and C followed by the subbeams after the second amplifying pass. Then, after the subbeams have been amplified a third and fourth time and are again returned to the phase gratings 122, they are observed to recombine into an essentially single, coherent output beam.

The cooled back plate heat sink employed in the present invention provides good heat removal from the amplifier elements, thereby ensuring efficient, long-lived operation. This type of heat sink is unique to the four-pass optical configuration described herein. If an attempt were made to employ this type of heat sink with the two-pass diode laser amplification system disclosed in the Stephens et al. Applied Physics Letters article mentioned above, in which light is coupled into and out of both amplifier facets, the heat sink/diode array would be considerably more difficult to fabricate. The cooled common backplate could not be employed, since this space would be occupied by the PCM in the two-pass system; each amplifier would accordingly have to have its own cooling channel. In addition, each amplifier would have to be cleaved so that both its front and rear edges exactly matched the edges of the shelf; if the amplifier is too short, the beam will be partially obscured by the heat sink and not coupled properly into the amplifier, while if the amplifier is too long there will be an overheating problem. With the described four-pass system, only the front edge of the amplifier must be matched with the front edge of the shelf, which is must easier to implement. The four-pass approach also allows the amplifiers to be half as long as required in a two-pass system while still providing the same gain in power extraction, which again enhances heat removal.

A novel system and method for greatly amplifying the power of an optical beam have thus been shown and described. Since numerous variations and alternate embodiments will occur to those skilled in the art, it is intended that the invention be limited only in terms of the appended claims.

We claim:

1. A four-pass phase conjugate optical power amplifier system, comprising:
   a polarized optical beam source,
   a bidirectional power amplifier for an optical beam emitted from the optical beam source, wherein said power amplifier comprises a diode laser structure,
   a phase conjugate mirror (PCM), and
   optical means for directing a polarized optical beam from the beam source in sequence through first and second passes through the power amplifier, to the PCM for phase conjugation thereby, and through third and fourth passes through the power amplifier, said optical means maintaining the beam's polarization substantially the same during said first and second amplifier passes, and substantially the same during said third and fourth amplifier passes.

2. A four-pass phase conjugate optical amplifier system, comprising:
   a polarized optical beam source,
   a bidirectional power amplifier for a polarized optical beam emitted from the optical beam source, wherein said power amplifier comprises a diode laser structure,
   a phase conjugate mirror (PCM), and
   optical means for directing the polarized optical beam from the beam source in sequence through first and second passes through the power amplifier, to the PCM for phase conjugation thereby, and through third and fourth passes through the power amplifier, said optical means maintaining the beam's polarization substantially the same during said first and second amplifier passes, and substantially the same during said third and fourth amplifier passes, wherein said optical means includes a reflective coating on one side of the diode laser structure for reflecting the beam from the first to the second and from the third to the fourth amplifying passes, and a non-reflective coating on the opposite side of the diode laser structure to prevent lasing.

3. The optical power amplifier system of claim 2, wherein said optical means orient the beam's polarization substantially parallel to the diode laser structure's TM mode for said first and second beam passes, and substantially parallel to the diode laser's TE mode for said third and fourth beam passes.

4. The optical power amplifier system of claim 1, wherein said beam source comprises a master oscillator.

5. A four-pass phase conjugate optical amplifier system, comprising:
   a polarized optical beam source,
   a bidirectional power amplifier for a polarized optical beam emitted from the optical beam source,
   a phase conjugate mirror (PCM), and
   optical means for directing the polarized optical beam from the optical beam source in sequence through first and second passes through the power amplifier, to the PCM for phase conjugation thereby, and through third and fourth passes through the power amplifier, said optical means maintaining the beam's polarization substantially the same during said first and second amplifier passes, and substantially the same during said third and fourth amplifier passes, wherein said beam is directed in a path from said beam source to said power amplifier, and said optical means reflect the beam back through the power amplifier along a portion of said path after the first and third passes therethrough, divert the beam from said path after the second power amplifier pass into the PCM, redirect the beam back onto said path after processing by the PCM for said third and fourth power amplifier passes, and divert the beam from said path along an output path after the fourth pass.

6. The optical power amplifier system of claim 5, wherein the optical beam source produces a substantially linearly polarized beam, and said optical means are polarization sensitive and rotate the beam polarization during transit from the beam source to said output path in coordination with said polarization sensitivity to direct the beam through said four passes.

7. The optical power amplifier system of claim 6, wherein said optical means divert the beam to said PCM and to said output path in a substantially common plane.

8. The optical power amplifier system of claim 1, said optical means including means for dividing a beam from said source into a plurality of subbeams prior to the first pass through the power amplifier and for recombining said subbeams into a single output beam after the fourth pass through the power amplifier, and said diode laser structure comprises an array of diode laser structures positioned to amplify respective subbeams.

9. A four-pass phase conjugate optical power amplifier system, comprising:
   a laser source which emits a substantially linearly polarized source beam,
   a first polarizing beam splitter (PBS) positioned in the source beam path to transmit the source beam, but to deflect a beam having a polarization normal to the source beam along an output path,
   a second PBS positioned in the source beam path downstream from the first PBS to transmit the source beam but to deflect a beam having a polarization normal to the source beam at the location of the second PBS,
   first polarization rotation means positioned between the first and second PBS for transmitting a source beam received from the first PBS to the second PBS with a polarization suitable for transmission by the second PBS, and transmitting a contradirected beam received from the second PBS to the first PBS with a polarization suitable for deflection by the first PBS,
   a phase conjugate mirror (PCM) positioned in the deflection path of the second PBS,
   a laser optical amplifier structure positioned in the source beam path downstream from the second PBS,
   means for reflecting a source beam transmitted in a first amplifying pass through the laser optical amplifier back through the laser optical amplifier in a second amplifying pass, and
   second polarization rotation means positioned in the source beam path between the second PBS and the laser optical amplifier for effecting a substantially 90° polarization rotation between a beam transmitted to the laser optical amplifier and the beam received back from the laser optical amplifier, whereby the laser beam transmitted through the second PBS is deflected by the second PBS to the PCM after the second amplifying pass, again deflected by the second PBS back to the laser optical amplifier for third and fourth amplifying passes therethrough after processing by the PCM, and transmitted by the second PBS through the first polarization rotation means to the first PBS after said fourth amplifying pass,
   said first polarization rotation means transmitting the beam received from said second PBS after the forth amplifying pass to the first PBS with a polarization suitable for deflection of the beam by the first PBS along said output path.

10. The optical power amplifier system of claim 9, said first and second polarization rotation means comprising respective combinations of a 45° Faraday rotator and a half-wave plate, said combinations being oriented so that the deflection paths of the first and second PBS are substantially coplanar.

11. The optical power amplifier system of claim 9, wherein said laser optical amplifier structure comprises a diode laser structure.

12. The optical power amplifier system of claim 11, wherein said reflecting means comprises a reflective coating on the diode laser structure to prevent lasing.

13. The optical power amplifier system of claim 12, wherein said second polarization rotation means polarizes the laser beam substantially parallel to the diode laser structure's TM mode for said first and second amplifying passes, and substantially parallel to the diode laser structure's TE mode for said third and fourth amplifying passes.

14. The optical power amplifier system of claim 9, further comprising a beam dividing means positioned between said second PBS and said second polarization rotation means for dividing a beam from said second PBS into a plurality of subbeams prior to said first amplifying pass, and for recombining said subbeams into a single output beam after said fourth amplifying pass, said amplifier structure comprising an array of diode laser structures positioned to amplify respective subbeams.

15. A four-pass phase conjugate optical power amplifier system, comprising:
   a substantially linearly polarized laser beam source,
   a diode laser structure including an optical amplification channel, a reflective coating at one end of the channel, and a non-reflective coating at the other end of the channel,
   a phase conjugate mirror (PCM), and
   optical means for directing a polarized laser beam from the beam source in sequence through first and second contradirectional amplifying passes through the diode laser structure, to the PCM for phase conjugation thereby, and through third and fourth contradirectional amplifying passes through the diode laser structure, the optical means including said reflective coating on the diode laser structure for directing the beam from said first to said second and from said third to said fourth amplifying passes.

16. The optical power amplifier system of claim 15, wherein said optical means orient the beam's polarization substantially parallel to the diode laser structure's TM mode for said first and second passes, and substantially parallel to the diode laser structure's TE mode for said third and fourth passes.

17. The optical power amplifier system of claim 15, said optical means rotating the beam polarization substantially 90° between the second and third amplifying passes.

18. A method of amplifying the power of a polarized laser beam, comprising in sequence:
   transmitting the beam in a first amplifying pass through a bidirectional optical power amplifier wherein said optical power comprises a diode laser structure,
   directing the beam back through the optical power amplifier in a second amplifying pass in a direction opposite to the first amplifying pass, and with substantially the same polarization orientation as the first pass,
   phase conjugating the beam and returning it to the optical power amplifier in a third amplifying pass in the same direction as the first amplifying pass,
   directing the beam back through the optical power amplifier in a fourth amplifying pass in the same direction as the second amplifying pass, and with substantially the same polarization orientation as the third pass, and
   directing the beam onto an output path.

19. A method of amplifying the power of a polarized laser beam, comprising in sequence:
   transmitting the beam in a first amplifying pass through a bidirectional optical power amplifier, wherein said optical power amplifier comprises a diode laser structure, directing the beam back through the optical power amplifier in a second amplifying pass in a direction opposite to the first amplifying pass, and with substantially the same polarization orientation as the first pass, phase conjugating the beam and returning it to the optical power amplifier in a third amplifying pass in the same direction as the first amplifying pass, directing the beam back through the optical power amplifier in a fourth amplifying pass in the same direction as the second amplifying pass, and with substantially the same polarization orientation as the third pass, wherein the beam is directed back through the diode laser structure for said second and fourth amplifying passes by a reflective coating on the diode laser structure, and directing the beam onto an output path.

20. The method of claim 19, wherein the beam polarization is rotated substantially parallel to the diode laser structure's TM mode for said first and second amplifying passes, and substantially parallel to the diode laser structure's TE mode for said third and fourth amplifying passes.

21. The method of claim 20, wherein the beam polarization is rotated substantially 90° between the second and third amplifying passes.

22. The method of claim 15, further comprising the steps of dividing the beam into a plurality of subbeams prior to its first pass through the optical power amplifier, implementing said first through fourth amplifying passes by transmitting each of said subbeams through respective optical power amplifiers, and recombining said subbeams after the fourth amplifying pass into a single output beam.

23. The method of claim 22, wherein each of said subbeams are directed along respective paths between the division of the beam into subbeams and phase conjugation thereof, which paths are substantially the optical reciprocals of the paths followed by said subbeams between phase conjugation and recombination into said output beam.

24. A four-pass optical power amplifier system, comprising:
an optical beam source,
an array of bidirectional optical amplifiers,
means for dividing a beam from said source into a plurality of subbeams and directing said subbeams in sequence through first and second amplifying passes through respective optical amplifiers within said array,
means for redirecting said subbeams through third and fourth amplifying passes through their respective optical amplifiers after said first and second passes, and
means for recombining said subbeams into a substantially common phase aggregate output beam after said fourth amplifying pass.

25. The system of claim 24, said redirecting means including a phase conjugate mirror (PCM) positioned to retro-reflect and phase conjugate said subbeams between the second and third amplifying passes, said PCM substantially compensating for differences in phase and optical path lengths between the subbeams.

26. A four-pass optical power amplifier system comprising:
an optical beam source,
an array of bidirectional optical amplifiers,
means for dividing a beam from said source into a plurality of subbeams and directing said subbeams in sequence through first and second amplifying passes through respective optical amplifiers within said array, said beam dividing means comprising a set of crossed phase gratings;
means for redirecting said subbeams through third and fourth amplifying passes through their respective optical amplifiers after said first and second passes, said redirecting means including a phase conjugate mirror (PCM) positioned to retro-reflect and phase conjugate said subbeams between the second and third amplifying passes, said PCM substantially compensating for differences in phase and optical path lengths between the subbeams, and
means for recombining said subbeams into a substantially common phase aggregate output beam after said fourth amplifying pass, said beam recombining means comprising said crossed phase gratings acting in cooperation with said PCM.

27. The system of claim 24, said optical amplifiers comprising diode laser structures.

28. The system of claim 27, wherein said diode laser structures are mounted in a substantially two-dimensional array on a common heat sink.

29. The system of claim 28, said heat sink comprising a body of thermoconductive material with a plurality of generally parallel and aligned shelves extending therefrom, said diode laser structures being distributed along said shelves in thermoconductive contact therewith.

30. The system of claim 29, further comprising a cooling channel in said heat sink body which carries a coolant fluid for dissipating heat from said diode laser structures through the heat sink body.

31. A four-pass phase conjugate optical power amplifier system, comprising:
a polarized optical beam source,
reciprocal beam dividing means for dividing a beam from said source into a plurality of polarized subbeams and for recombining a contradicted plurality of subbeams into a single beam,
an array of bidirectional power amplifiers, each power amplifier corresponding to a respective subbeam,
a phase conjugate mirror (PCM), and
optical means for directing a polarized beam from said source to said reciprocal beam dividing means, for directing subbeams from said reciprocal beam dividing means in sequence through first and second passes through their respective power amplifiers, to the PCM for phase conjugation thereby, through third and fourth passes through their respective power amplifiers, and back to said reciprocal beam dividing means for recombination into a single beam, and for directing said single recombined beam onto an output path, said optical means maintaining the subbeams' polarization substantially the same during said first and second amplifying passes, and substantially the same during said third and fourth amplifying passes.

32. The system of claim 31, wherein said power amplifiers comprise respective diode laser structures.

33. A four-pass phase conjugate optical power amplifier system, comprising:
a polarized optical beam source,
reciprocal beam dividing means for dividing a beam from said source into a plurality of polarized subbeams and for recombining a contradicted plurality of subbeams into a single beam, an array of bidirectional power amplifiers, each power amplifier corresponding to a respective subbeam, wherein said power amplifiers comprise respective diode laser structures, a phase conjugate mirror (PCM), and optical means for directing a polarized beam from said source to said reciprocal beam dividing means, for directing subbeams from said reciprocal beam dividing means in sequence through first and second passes through their respective power amplifiers, to the PCM for phase conjugation thereby, through third and fourth passes through their respective power amplifiers, and back to said reciprocal beam dividing means for recombination into a single beam, and for directing said single recombined beam onto an output path, said optical means maintaining the subbeams' polarization substantially the same during said first and second amplifying passes, and substantially the same during said third and fourth amplifying passes, wherein said optical means includes a reflective coating on one side of each diode laser structure for reflecting its respective subbeam from the first to the second and from the third to the fourth amplifying passes, and a nonreflective coating on the opposite side of each diode laser structure.

34. The system of claim 33, wherein said optical means orient the polarization of each subbeam substantially parallel to the TM mode of its respective diode laser structure for said first and second amplifying passes, and substantially parallel to the TE mode of its respective diode laser structure for said third and fourth amplifying passes.

35. The system of claim 32, wherein said diode laser structures are mounted in a substantially two-dimensional array on a common heat sink.

36. The system of claim 35, said heat sink comprising a body of thermoconductive material with a plurality of generally parallel and aligned shelves extending therefrom, said diode laser structures being distributed along said shelves in thermoconductive contact therewith.

37. The system of claim 36, further comprising a cooling channel in said heat sink body which carries a coolant fluid for dissipating heat from said diode laser structures through the heat sink body.

38. The system of claim 31, said reciprocal beam dividing means comprising a pair of crossed phase gratings, said PCM substantially compensating for differences in phase and optical path lengths between the subbeams, and orienting the subbeam wavefronts so that the crossed phase gratings recombine the subbeams into a single output beam after said fourth amplifying pass.

39. The system of claim 31, said optical means directing said subbeams through said reciprocal beam dividing means to said PCM after said second amplifying pass, and back through said reciprocal beam dividing means from said PCM to said power amplifiers for said third amplifying pass, said reciprocal beam dividing means being wavefront sensitive to divide each subbeam into a respective subplurality of subbeams during passage to said PCM, and to restore each of said subplurality of subbeams back to the original number of subbeams after phase conjugation by said PCM.

* * * * *